United States Patent
Yu et al.

(10) Patent No.: US 8,652,260 B2
(45) Date of Patent: Feb. 18, 2014

(54) APPARATUS FOR HOLDING SEMICONDUCTOR WAFERS

(75) Inventors: Chen-Hua Yu, Hsin-Chu (TW); Chien Ling Hwang, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 925 days.

(21) Appl. No.: 12/347,580

(22) Filed: Dec. 31, 2008

(65) Prior Publication Data

US 2010/0032096 A1 Feb. 11, 2010

Related U.S. Application Data

(60) Provisional application No. 61/087,468, filed on Aug. 8, 2008.

(51) Int. Cl.
*C23C 16/00* (2006.01)
*C23F 1/00* (2006.01)
*H01L 21/306* (2006.01)

(52) U.S. Cl.
USPC . 118/729; 118/725; 156/345.37; 156/345.52; 156/345.54

(58) Field of Classification Search
USPC .................. 118/715, 722, 724, 725, 728, 729; 156/345.51, 345.52, 345.54
See application file for complete search history.

(56) References Cited

U.S. PATENT DOCUMENTS

| 6,227,786 | B1 | 5/2001 | Tateyama |
| 7,764,355 | B2 | 7/2010 | Ohmi et al. |
| 2002/0102864 | A1* | 8/2002 | Rossman ...................... 438/798 |
| 2002/0113056 | A1* | 8/2002 | Sugaya et al. ............. 219/444.1 |
| 2010/0212832 | A1* | 8/2010 | Wakasaki et al. ........ 156/345.43 |

FOREIGN PATENT DOCUMENTS

| CN | 101114605 A | | 1/2008 |
| KR | 2006056653 A | * | 5/2006 |
| WO | 03001658 A1 | | 1/2003 |
| WO | WO 2007077765 A1 | * | 7/2007 |

OTHER PUBLICATIONS

English Machine Translation of KR 2006056653. Obtained on Jun. 19, 2012 from http://patent2.kipris.or.kr/pateng/resulta.do.*

* cited by examiner

*Primary Examiner* — Maureen Gramaglia
(74) *Attorney, Agent, or Firm* — Slater & Matsil, L.L.P.

(57) ABSTRACT

Apparatus for holding semiconductor wafers during semiconductor manufacturing processes are disclosed. In one embodiment, the apparatus comprises a heat-conductive layer disposed on a supporting base. The apparatus also comprises a plurality of holes formed through the heat-conductive layer and the supporting base. The apparatus further comprises a plurality of heat-conductive lift pins that extend through the holes over the heat-conductive layer at the top end, and make a direct contact with a wafer substrate. The heat-conductive layer and the lift pins are connected to a heating circuit.

13 Claims, 11 Drawing Sheets

APPARATUS FOR HOLDING SEMICONDUCTOR WAFERS

CROSS-REFERENCES

This application claims the benefit of the following provisionally filed U.S. Patent Application Ser. No. 61/087,468, filed Aug. 8, 2008, and entitled "Apparatus for Holding Semiconductor Wafers," which application is hereby incorporated herein by reference.

TECHNICAL FIELD

The present invention relates generally to an apparatus for holding semiconductor wafers during semiconductor manufacturing processes, and more particularly to wafer holding apparatus and methods that realize wafer temperature uniformity in processes with high heat stress.

BACKGROUND

Manufacturing a semiconductor integrated circuit (IC) typically involves numerous processing techniques that require elevated wafer temperatures to perform the desired processes, such as chemical vapor deposition (CVD), physical vapor deposition (PVD), dry etching, or other processing techniques. As a known wafer holding apparatus, an electrostatic chuck including a heating element is commonly employed to support a semiconductor wafer in a stationary position and transfer heat generated from the heating element to the wafer during the various processes.

FIG. 1 illustrates a prior art dipole-type electrostatic chuck 10 utilized as a wafer supporting and heating apparatus. Electrostatic chuck 10 comprises either a pair of or plural pairs of electrodes 12 embedded in a wafer supporting stage, which typically comprises a mounting surface 15 made of heat conducting dielectrics, such as a heat conducting ceramic. When an alternating voltage is applied between the electrodes 12, a reverse polarity charge is typically induced in wafer substrate 18. Wafer substrate 18 is thus electrostatically attracted to the supporting stage utilizing the force generated between the wafer substrate and the electrodes. A heating circuit is also used to supply electricity to the supporting stage to heat the mounting surface 15 of the electrostatic chuck 10. Heat transfer then occurs between mounting surface 15 and wafer substrate 18 held thereon so that wafer substrate 18 reaches a desired temperature range suitable for processing the wafer.

Conventional electrostatic chucks, however, have the following problems. First, during a wafer fabrication process, such as a CVD or impurity doping process, a semiconductor wafer may be subjected to an elevated temperature on the order of 800° C. or higher. The wafer processed within such a high temperature range may be under significant heat stress, which typically causes wafer bowing or warping as illustrated in FIG. 1. This problem causes the wafer substrate 18 to lose direct abutting contact with the mounting surface 15 where the bowing or warping occurs. A considerable portion of the heat generated by mounting surface 15 would be transferred to the wafer spots that contact mounting surface 15, but not to the bowed or warped portions of wafer substrate 18. This causes further temperature non-uniformity in wafer substrate 18.

Additionally, for the system where alternating voltage is applied to the electrodes 12, electric charge is accumulated in the back surface of wafer substrate 18 while the wafer is being attracted, and the accumulated charge makes the separation of the substrate from the chuck difficult. Moreover, although an electrostatic chuck operated through an alternating voltage exerts an attractive force to the wafer substrate held thereon, the attractive force is typically not adapted to the mechanical stress created by the uneven heat distribution in a wafer substrate. As a result, when the mechanical stress accumulated in a wafer substrate exceeds a critical point, the wafer substrate may crack or even break.

Furthermore, the trend of increasing wafer diameter in semiconductor manufacturing continues as part of the effort to increase the throughput of a semiconductor fabrication facility and offset the high cost imposed by the processing equipment in advanced processing technology. The uneven heat distribution as described above may create increased mechanical stress in a wafer substrate of increased dimension, causing more severe bowing or warping effects.

SUMMARY OF THE INVENTION

These and other problems are generally solved or circumvented, and technical advantages are generally achieved, by preferred embodiments of the present invention. The preferred embodiments provide a wafer holding apparatus that comprises a heat-conductive layer disposed on a supporting base, and a plurality of heat-conductive lift pins coupled to a heating circuit. The heat-conductive lift pins can extend through the holes over the heat-conductive layer at the top end, and make a direct contact with a wafer substrate even after a direct abutting contact between the wafer substrate and the supporting surface is lost due to wafer bowing or warping, thus leading to even temperature distribution on a wafer substrate.

In accordance with a preferred embodiment of the present invention, a wafer holding apparatus for processing a semiconductor wafer comprises a heat-conductive layer disposed on a supporting base, the heat-conductive layer being coupled to a heating circuit, a plurality of holes formed through the heat-conductive layer and the supporting base, and a plurality of heat-conductive lift pins coupled to the heating circuit and extending through the holes and over the heat-conductive layer, each of the plurality of lift pins having a top end for making direct contact with a wafer.

In accordance with another preferred embodiment of the present invention, a wafer holding apparatus for processing a semiconductor wafer comprises a heat-conductive layer disposed on a supporting base, the heat-conductive layer being coupled to a heating circuit, a clamper supporting ring fastened on an edge of the supporting base, a plurality of wafer substrate clampers attached to the clamper supporting ring, and a control circuit coupled to the plurality of wafer substrate clampers for clamping and unclamping the plurality of wafer substrate clampers.

In accordance with yet another preferred embodiment of the present invention, a heater used for processing a semiconductor wafer comprises a heat-conductive layer disposed on a supporting base, the heat-conductive layer being coupled to a heating circuit, a first plurality of holes formed through the heat-conductive layer, the first plurality of holes being distributed in an inner zone near the center of the heat-conductive layer and an outer zone near the edge of the heat-conductive layer, a first vacuum source coupled to the holes in the inner zone, and a second vacuum source coupled to the holes in the outer zone.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely wafer holding apparatus and methods that realize even temperature distribution in a wafer substrate during processes involving elevated wafer temperature, such as chemical vapor deposition (CVD), impurity doping, rapid thermal process (RTP), anneal, and metal deposition. Preferred embodiments may be used to heat wafer substrates of various diameter, achieving even temperature distribution across a wafer substrate to perform desired processes. Also, preferred embodiments may provide a wafer holding mechanism that is adaptive to the mechanical stress built in a wafer substrate so that the heat-induced mechanical stress built in a wafer substrate during an elevated temperature process may be released in a process with reduced processing temperature. It is noted that, although the present invention has been described in conjunction with specific embodiments, it is to be understood that the present invention is not limited to these embodiments and many modifications and variations may be made without departing from the scope and spirit of the present invention as specifically defined in the preferred embodiments. As an example, preferred embodiments may be used to other semiconductor manufacturing processes where uniform heat distribution on a semiconductor working piece are desired for processing.

Figure 1:
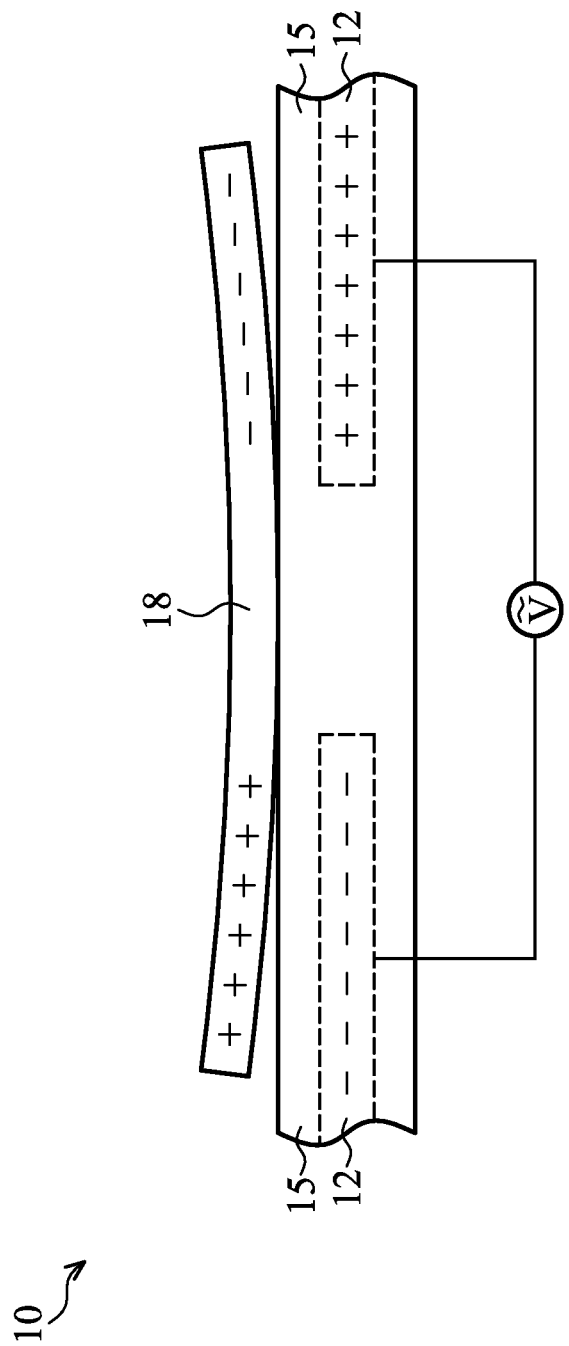
FIG. 1 illustrates a prior art dipole-type electrostatic chuck.
Figure 2A:
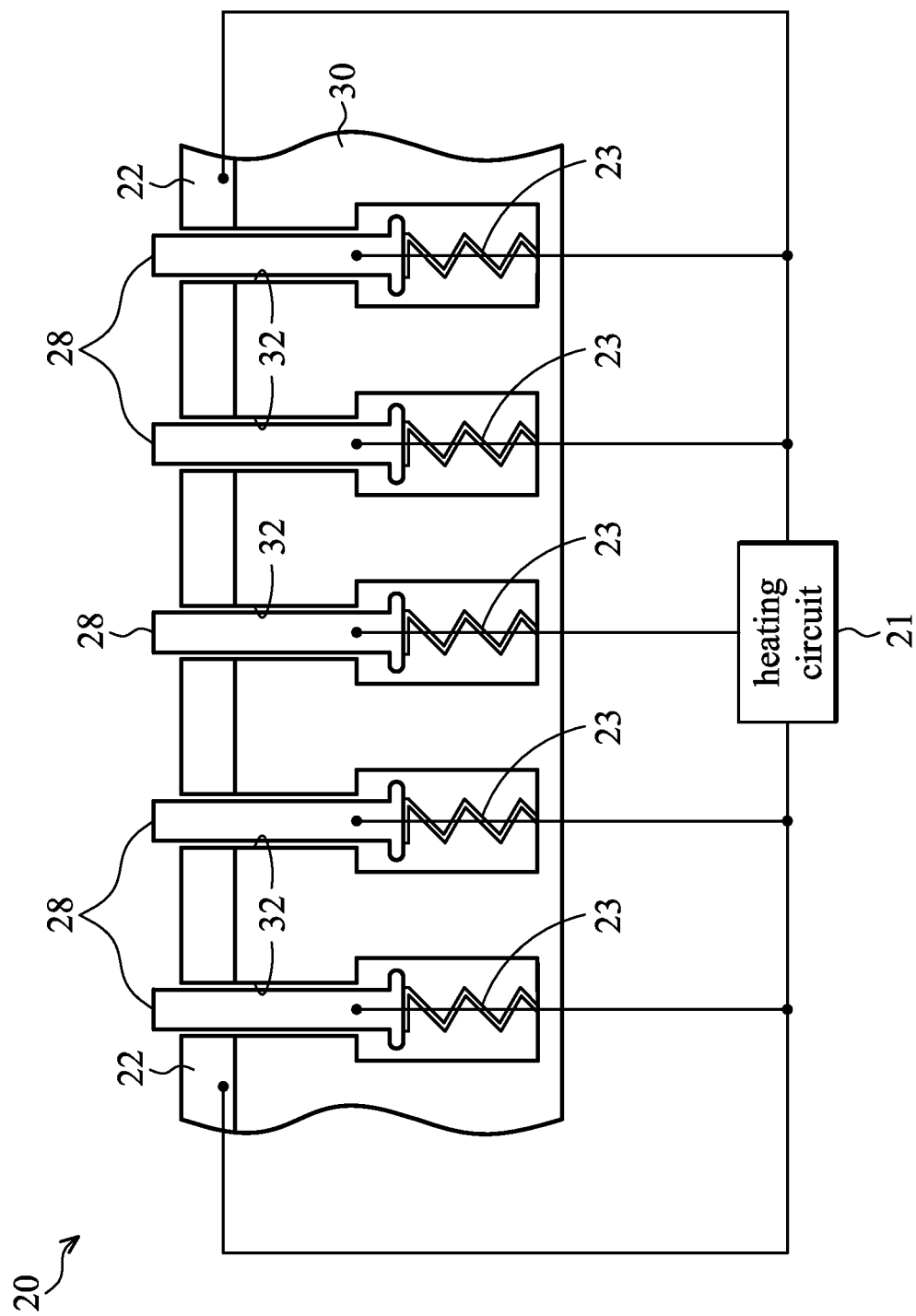
FIGS. 2A, 2B, 3, 4A, and 4B are cross-sectional views of illustrative embodiments of the present invention.

With reference now to FIG. 2A, there is shown a wafer holding apparatus 20 that comprises a heat-conductive layer 22. The heat-conductive layer 22 is supported on a supporting base 30, with the top surface of the heat-conductive layer 22 forming a wafer supporting surface. Therefore, the heat-conductive layer 22 is also sometimes referred to as wafer supporting surface 22 in the description below. The heat-conductive layer 22 may comprise a wide range of materials. In one embodiment, the heat-conductive layer 22 includes a dielectric material, such as aluminum nitride and pyrolytic boron nitride. In another embodiment, heat-conductive layer 22 comprises an electrically conductive material, such as pyrolytic graphite.

A plurality of lift pins 28 extends through holes 32 formed through heat-conductive layer 22 and supporting base 30. Lift pins 28 are made of heat conductive materials similar to those used to form heat-conductive layer 22, such as aluminum nitride, pyrolytic boron nitride and pyrolytic graphite. Each of the lift pins 28 is supported by an elastic spring 23 attached to supporting base 30. A heating circuit 21 is used to supply electricity to the wafer supporting surface 22 and lift pins 28 to heat a wafer substrate (not shown) held on wafer supporting surface 22 so that the wafer substrate reaches a desired temperature range suitable for processing. In an embodiment, the wafer substrate is processed in a CVD process, during which it is subjected to an elevated temperature of greater than 800° C. Under such a high processing temperature, significant heat stress is typically formed in the wafer substrate, which may cause the wafer substrate to bow or warp.

Figure 2B:
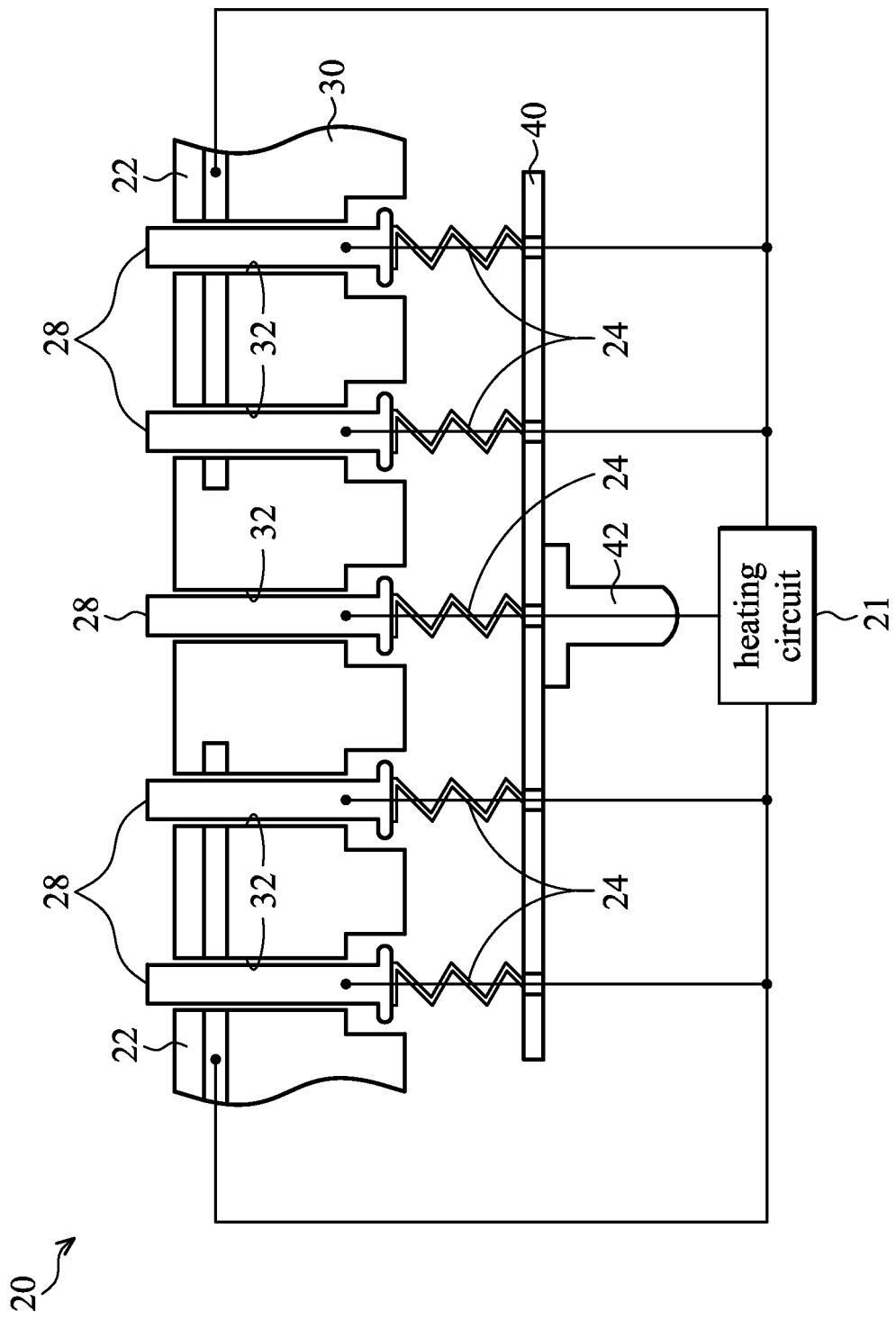

FIG. 2B illustrates another preferred embodiment, where each of the lift pins 28 is supported by an elastic spring 24 attached to a lift table 40. The lift table 40 is cantilevered from the top end of a rotation motor and cylinder 42 that is axially translated by a lift motor assembly. The rest position of lift pins 28 is adjustable by positioning lift table 40 axially. In another embodiment, lift table 40 may be fastened to supporting base 30. In an additional preferred embodiment, each of the lift pins 28 is supported by an air cylinder with sealed, compressive air that is used in place of an elastic spring. In preferred embodiments, lift pins 28 are free to move up and down axially. Preferably, when wafer holding apparatus 20 is idle, the tips of lift pins 28 protrude over the wafer supporting surface 22 to an extent that, when a wafer substrate to be processed is rested on wafer supporting surface 22, the weight of the wafer substrate presses down the lift pins 28 so that the wafer substrate forms a direct abutting contact with the wafer supporting surface 22.

Figure 3:
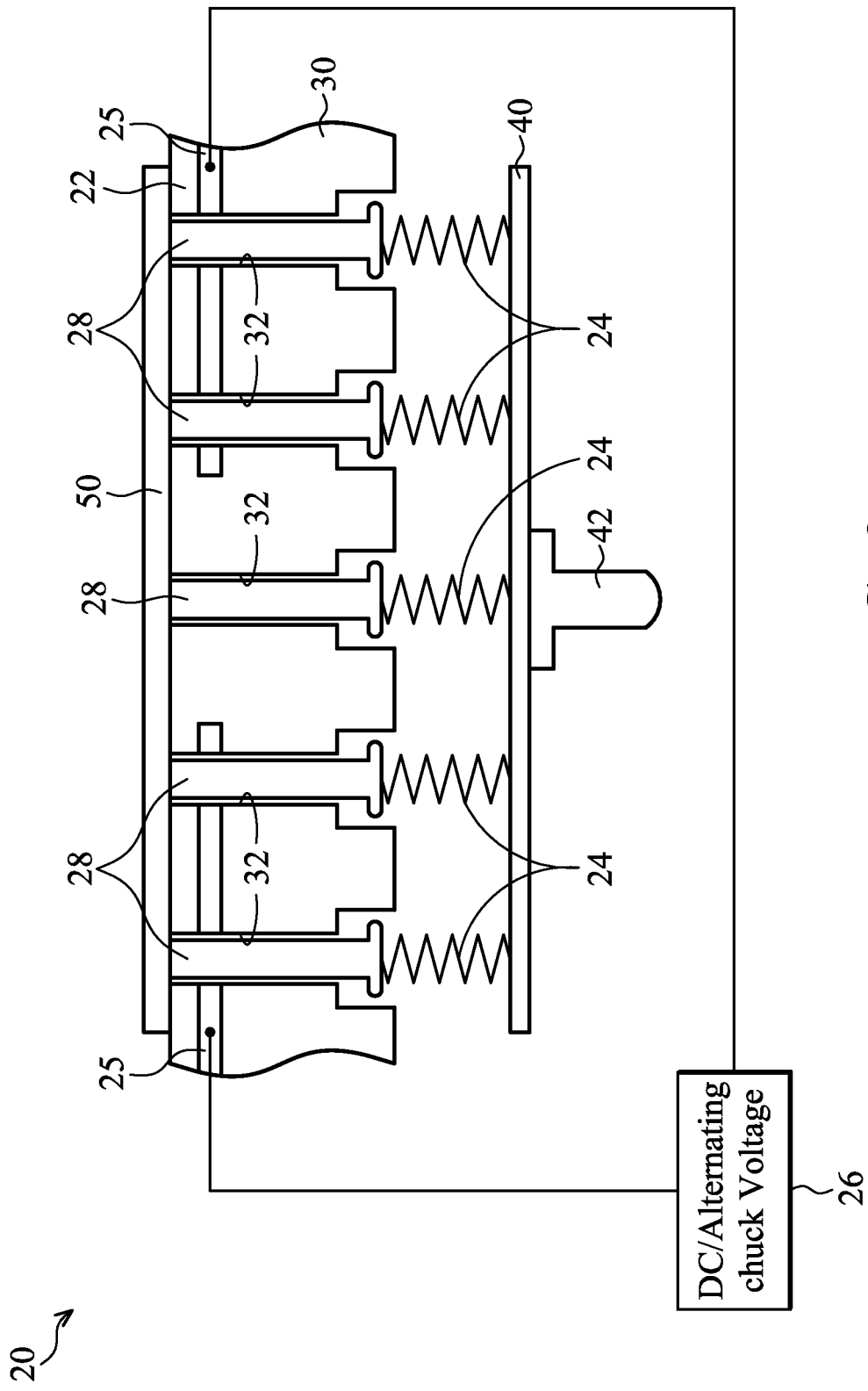

FIG. 3 illustrates wafer holding apparatus 20 with a wafer substrate 50 resting thereon. The back-end of wafer substrate 50 is in direct abutting contact with the wafer supporting surface 22 and lift pins 28. Optionally, when holding apparatus 20 is used in a plasma reactor chamber, such as a plasma enhanced CVD (PECVD) tool, heat conductive layer 22 may also encapsulate a thin planar chucking electrode or conductive grid 25, which is coupled to a DC or alternating chuck voltage source 26, forming a DC type or dipole-type electrostatic chuck configuration. When a DC chuck voltage is applied to the electrode 25, the wafer substrate 50 is typically referenced to ground through the plasma. The application of a large DC voltage to chucking electrode 25 produces a large electrostatic force that holds the wafer on wafer supporting surface 22. When an alternating voltage is applied between the electrodes 25, a reverse polarity charge is typically induced on the back side of wafer substrate 50. Wafer substrate 50 is thus attracted to wafer support surface 22 via the electrostatic force generated between wafer substrate 50 and electrodes 25.

It is noted that, although the above preferred embodiments are illustrated in conjunction with a CVD processing apparatus, those skilled in the art should realize that the preferred embodiments may be also applied to other wafer fabrication processes and apparatus where an elevated wafer temperature is needed, such as a rapid thermal process (RTP) using a hot chuck, a thermal anneal process (e.g., silicidation), and a metal deposition process, impurity doping, and the like, without departing from the scope and spirit of the present invention as specifically defined in the preferred embodiments.

Figure 4A:
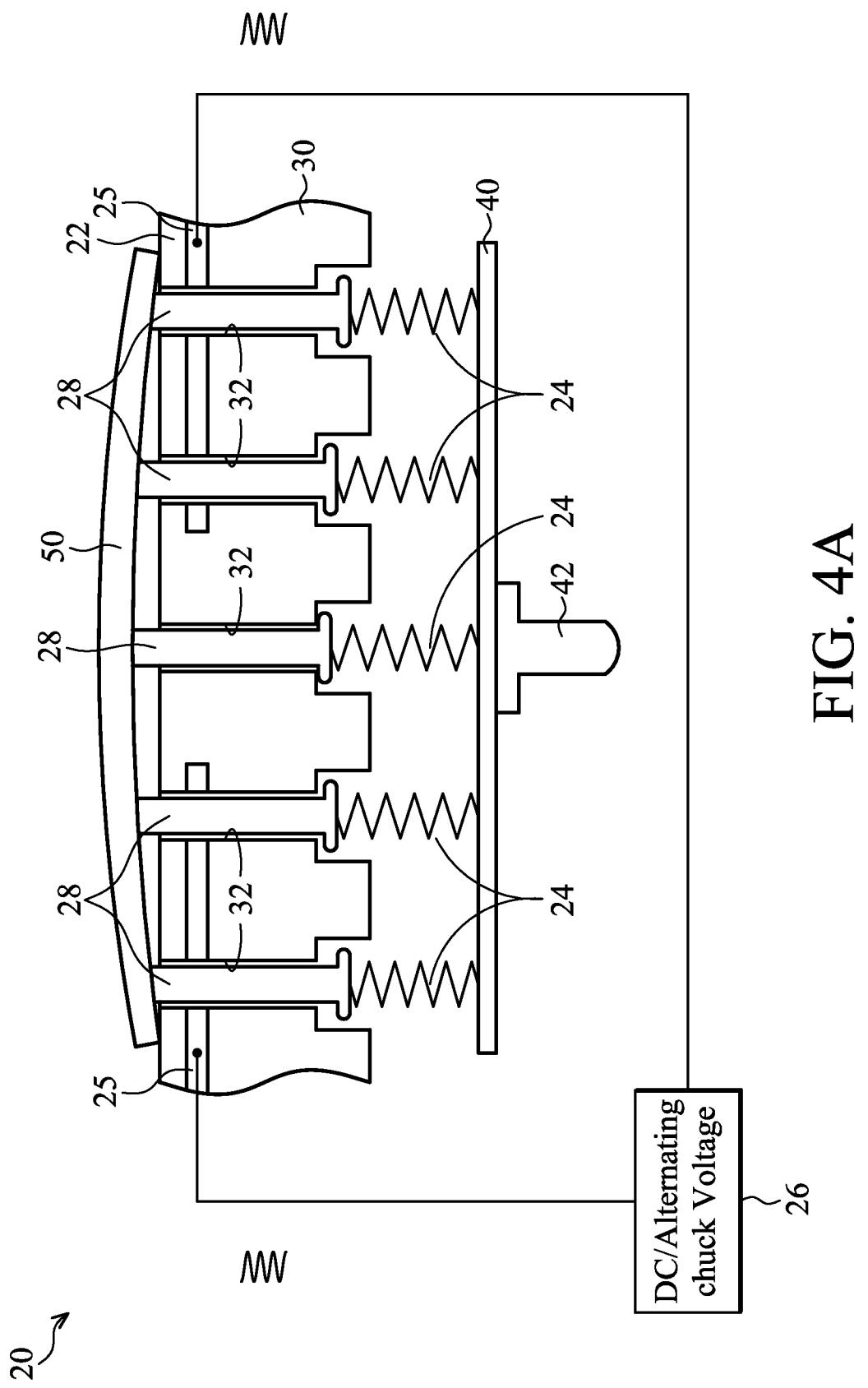
Figure 4B:
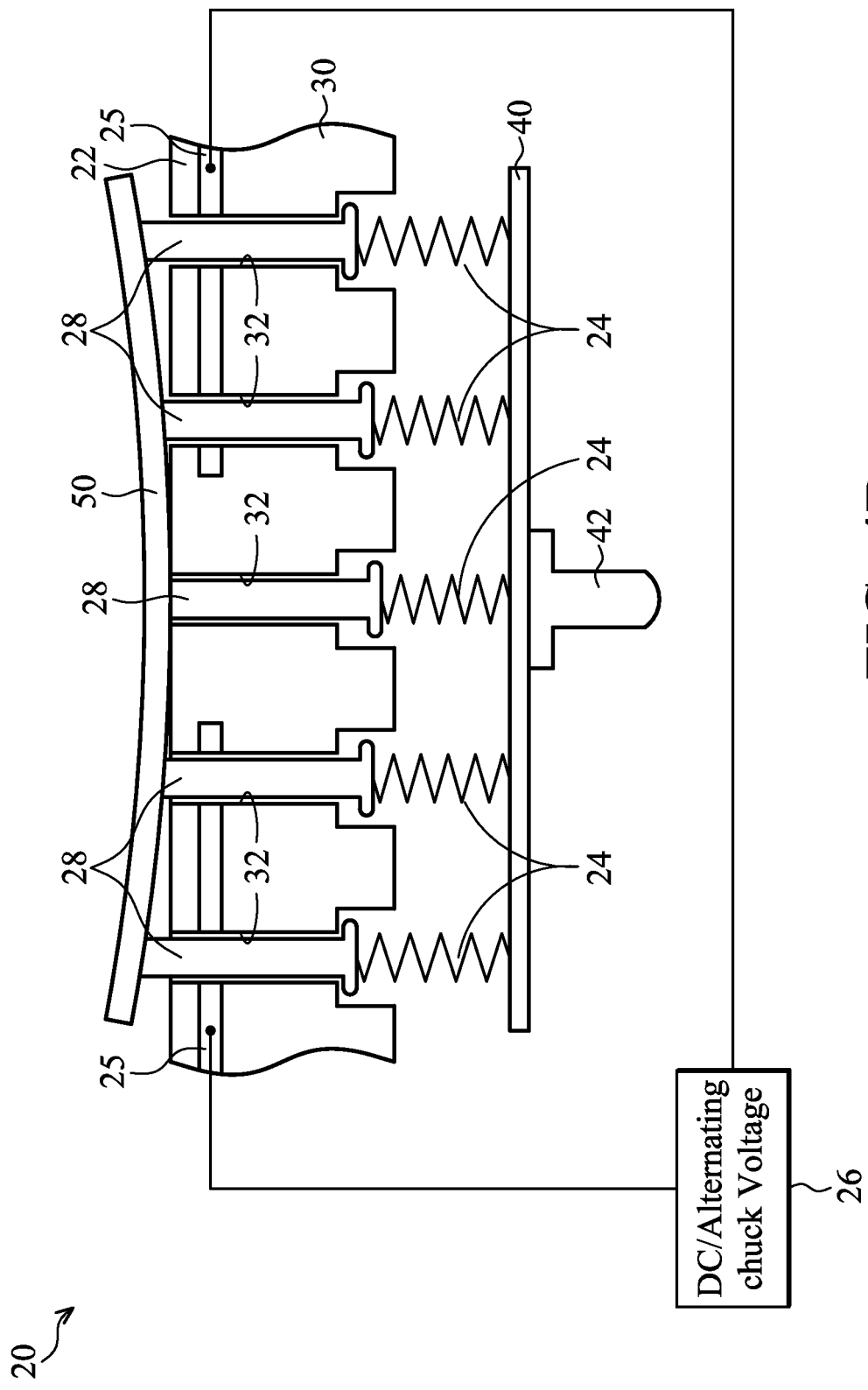

FIGS. 4A-4B are collectively used to illustrate bowing and warping that may occur to wafer substrate 50 when high heat stress is applied. The bowing and warping effects are exaggerated to illustrate the advantageous features achieved with the current embodiment. As can be seen from FIGS. 4A-4B, when an air gap is formed between the wafer substrate 50 and the wafer supporting surface 22 due to wafer bowing or warping, lift pins 28 attached to the compressed springs extend upwards above the wafer supporting surface 22 so that the top end of lift pins 28 makes direct contact with the back end of wafer substrate 50. Because lift pins 28 are also heated by being coupled to the supply electricity that is used to heat wafer supporting surface 22, wafer substrate 50 may be continuously heated by lift pins 28 even after direct abutting contact with the supporting surface 22 is lost due to wafer bowing or warping, thus leading to even temperature distribution on wafer substrate 50.

Figure 5:
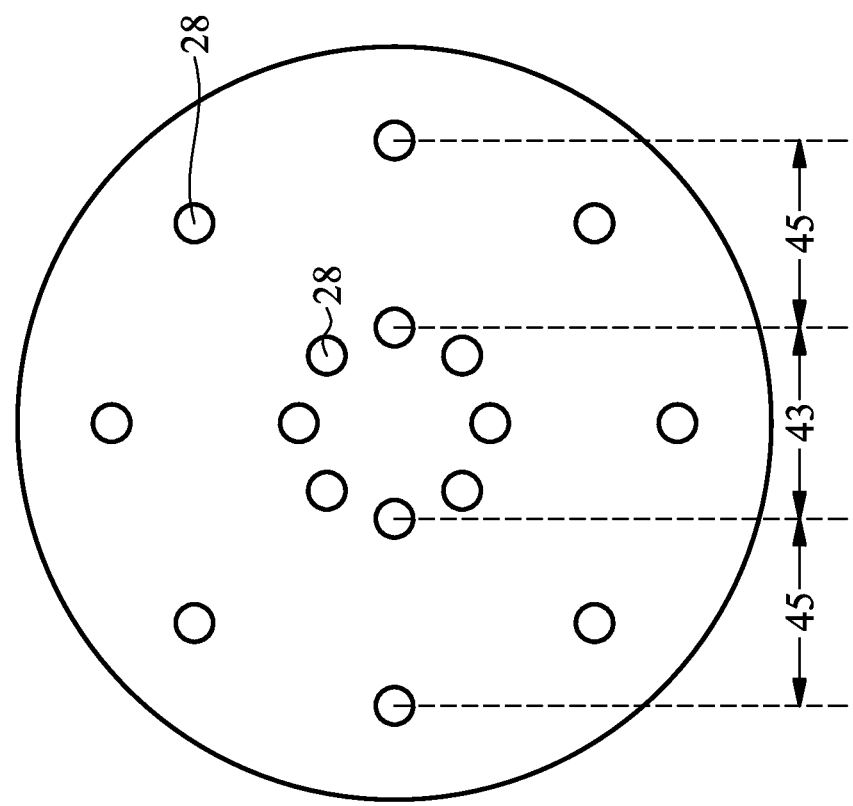
FIG. 5 shows a plan view of an illustrative embodiment of the present invention.

FIG. 5 is a plan view illustrating one preferred embodiment of the wafer holding apparatus 20, which comprises a plurality of lift pins 28 distributed in a concentric fashion in an inner zone 43 and an outer zone 45. It is noted that the pattern of the lift pins 28 shown in FIG. 5 is only for illustrative purpose and should not be construed as being limited to the pattern set forth herein. In reality, wafer holding apparatus 20 may be formed to include various lift pin 28 patterns depending upon the dimension of wafer substrate 50 to be processed, the desired process temperature, the temperature uniformity needed to process the wafer substrate without significant impact on the product yield.

It is noted, however, the dimension of lift pins 28 and the density of lift pins 28 may impact the securing of direct abutting contact between wafer substrate 50 and wafer supporting surface 22, thus providing even temperature distribution on wafer substrate 50. In preferred embodiments, the dimension (e.g., diameter) of lift pins 28 is preferably in the range of from about $1/100$ of the wafer dimension to about $1/10$ of the wafer dimension. The density of lift pins 28, measured by the pin-to-pin pitch, is optimized to provide even temperature distribution on wafer substrates with various materials and dimensions, and is preferably in the range of from about $1/50$ of the wafer dimension (e.g., diameter) to about $1/10$ of the wafer dimension. In preferred embodiments, the number of lift pins formed on a wafer holding apparatus ranges from just a few to over a hundred, depending upon the dimension of wafer substrate to be processed, the desired process temperature, and the temperature uniformity needed to process the wafer substrate without significant impact on the product yield. As an example shown in FIG. 5, a wafer holding apparatus with eight lift pins in inner zone 43 and eight lift pins in outer zone 45 may be used to process a III-V semiconductor wafer having a diameter of four inches. As another example, a wafer holding apparatus with a hundred lift pins may be employed to process a twelve-inch silicon wafer.

It is also noted that the DC or alternating chuck voltages applied to chucking electrode 25 may be varied through a control circuit so that the electrostatic force formed between wafer substrate 50 and electrodes 25 may be changed continuously or turned on and off intermittently, adapting to processes having different heat stress levels. As an example, during a high temperature process where even temperature distribution is highly critical, a large electrostatic force may be formed between wafer substrate 50 and electrodes 25, creating the desired direct abutting contact between wafer substrate 50 and wafer supporting surface 22. However, the high mechanical stress thus created in wafer substrate 50 may be quickly alleviated or released by reducing the electrostatic force formed between wafer substrate 50 and electrodes 25 through adjusting of the DC or alternating chuck voltages applied to chucking electrode 25.

Figure 6A:
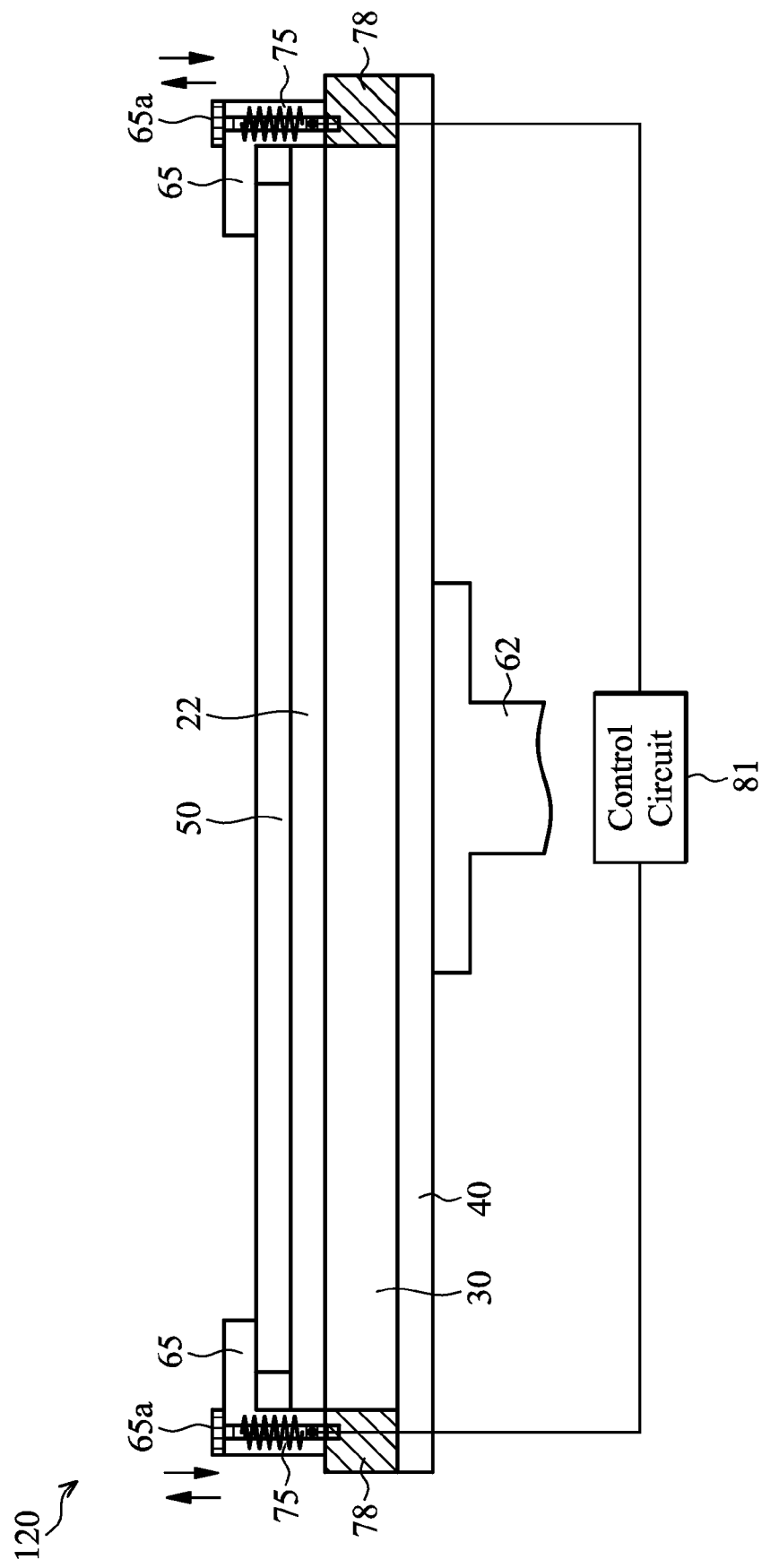
FIGS. 6A-6B illustrates a cross-sectional and a plan view, respectively, of an illustrative embodiment of the present invention.
Figure 6B:
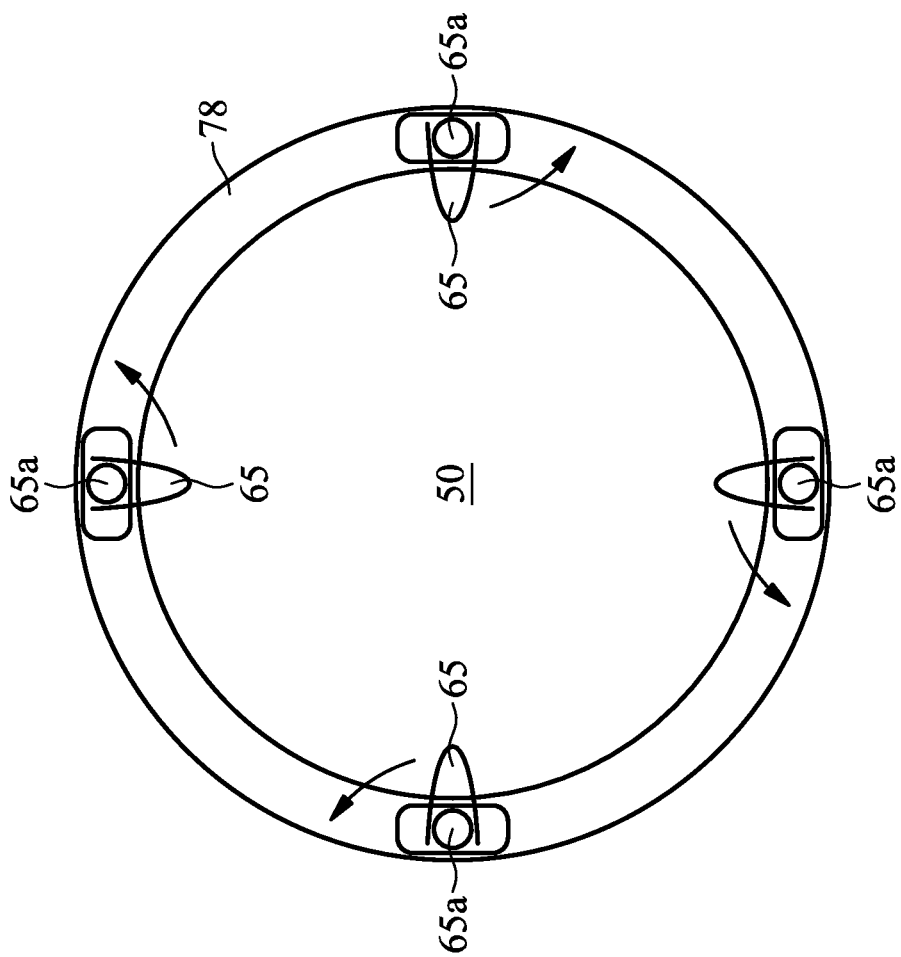

FIGS. 6A-6B are cross-sectional and plan views used to illustrate wafer holding apparatus 120 in another preferred embodiment. Wafer holding apparatus 120 comprises a heat-conductive layer 22, which is supported on a supporting base 30. The top surface of the heat-conductive layer 22 forms a wafer support surface. Wafer holding apparatus 120 also comprises a plurality of wafer substrate clampers 65 secured to a clamper supporting ring 78, which is fastened on the edge of supporting base 30. The clampers 65 can be rotated horizontally between a locked and unlocked position to secure wafer substrate 50 on heat-conductive layer 22. Alternatively, clampers 65 may be lowered and raised between locked and unlocked positions. A heating circuit is used to supply electricity to the wafer supporting surface 22 to heat wafer substrate 50 held thereon so that wafer substrate 50 reaches a desired temperature range suitable for processing. Optionally, supporting base 30 is secured on lift table 40, which is cantilevered from the top end of a rotation motor or cylinder 62 that is axially translated by a lift motor assembly.

Each of the clampers 65 may be attached onto the clamper supporting ring 78 at one end by a fastener 65a. The clampers 65 are used to secure a direct abutting contact between wafer substrate 50 and wafer supporting surface 22 during a high temperature process where even temperature distribution is highly critical. However, the elastic spring 75 may be deactivated through a control circuit 81 so that the clamping force on the edge of wafer substrate 50 can be relieved instantaneously. In other words, in some embodiments, elastic spring 75 may have an electromechanical component such as an electromagnet or may comprise a material that deforms in the presence of an electrical field or electric current. As a result, the high mechanical stress created in wafer substrate 50 during a high temperature process may be quickly alleviated or released by removing the clamping force on wafer substrate 50. In a preferred embodiment, elastic springs 75 in clampers 65 are activated and deactivated in an intermittent manner, adapting to processes having different heat stress levels. As an example, during a high temperature process where even temperature distribution is highly critical, clampers 65 are activated securing the desired direct abutting contact between wafer substrate 50 and wafer supporting surface 22. After that, the high mechanical stress thus created in wafer substrate 50 may be quickly alleviated or released by deactivating clampers 65, thus removing the clamping force on wafer substrate 50. In some embodiments, clampers 65 may be used in combination with lift pins 28, such as illustrated in FIGS. 4A and 4B to provide even further flexibility in control the transfer of heat to a substrate 50.

Figure 7A:
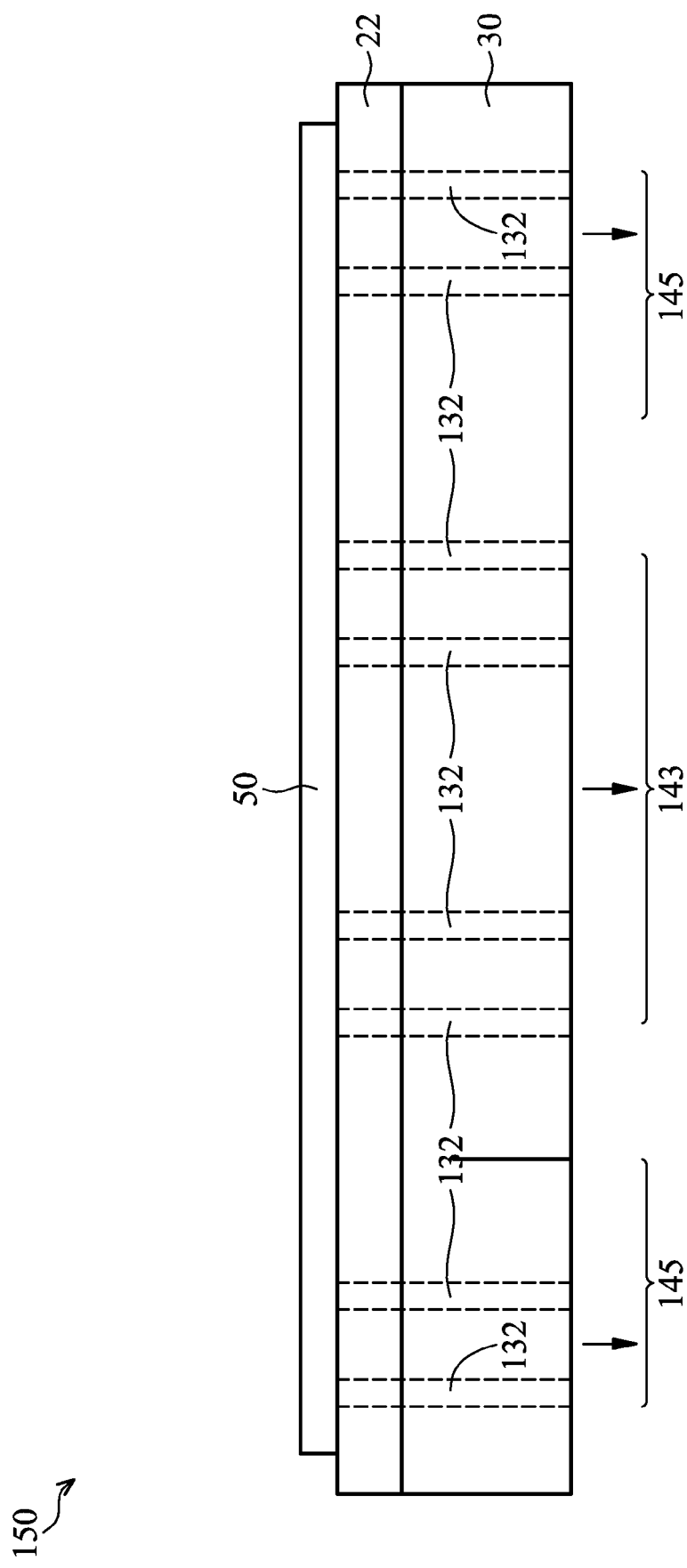
FIGS. 7A-7B illustrates a cross-sectional and a plan view, respectively, of an illustrative embodiment of the present invention.
Figure 7B:
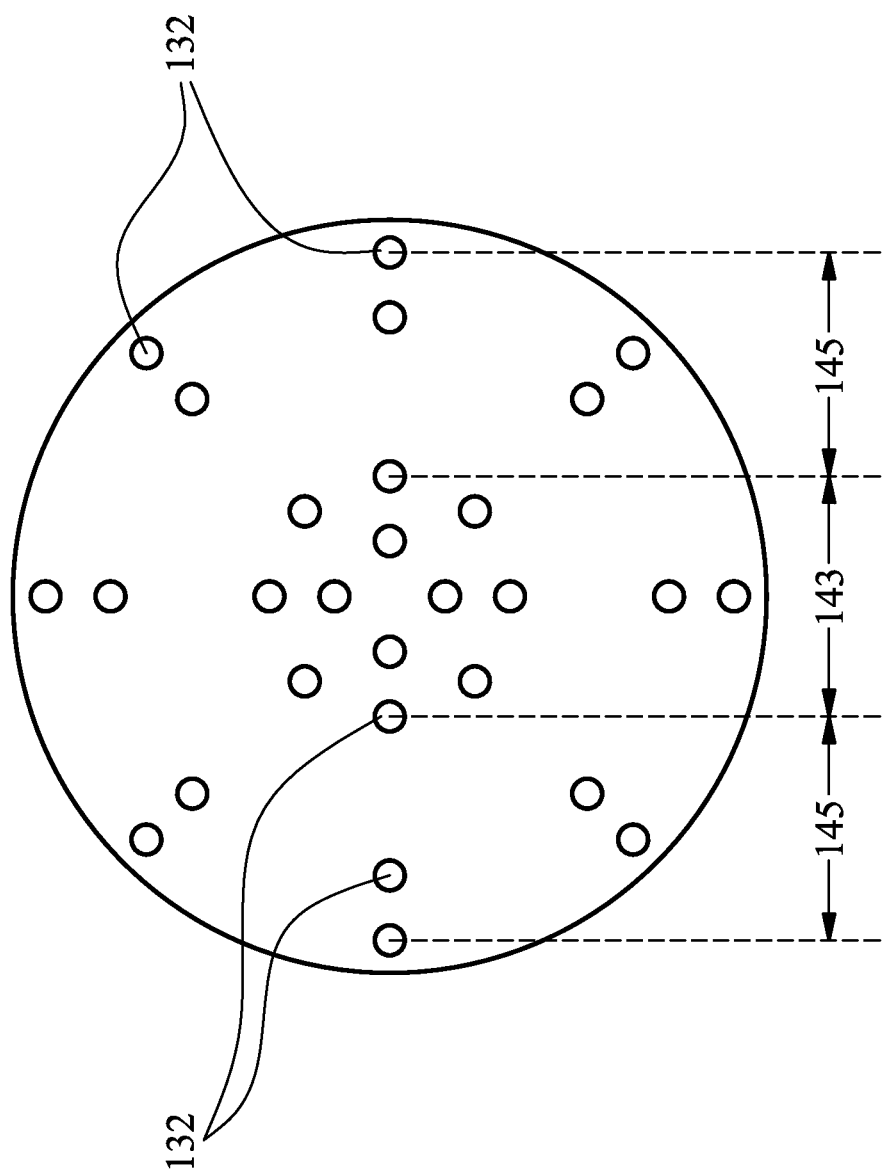

FIGS. 7A-7B are cross-sectional and plan views used to illustrate wafer holding apparatus 150 in an alternative or additional preferred embodiment. Wafer holding apparatus 150 comprises a heat-conductive layer 22. The heat-conductive layer 22 is supported on a supporting base 30, with the top surface of the heat-conductive layer 22 forming a wafer support surface. One skilled in the art will recognize that a lift table 40, such as illustrated in FIG. 4A could also be employed in the embodiment illustrated in FIG. 7A. A heating circuit (not shown) is preferably used to supply electricity to the wafer supporting surface 22 and to heat wafer substrate 50 held thereon so that wafer substrate 50 reaches an even temperature distribution in a desired temperature range suitable for processing. A plurality of holes 132 are formed through heat-conductive layer 22 and supporting base 30. The holes 132 are preferably distributed in a concentric fashion with an inner zone 143 and an outer zone 145. The inner zone 143 and the outer zone 145 at the back end of supporting base 30 may be connected to same or separate vacuum sources. When one or more of the vacuum sources are turned on, attractive forces are formed on the wafer supporting surface 22, holding wafer substrate 50 thereon for the desired process. In the current embodiment, the attractive forces at the inner and outer vacuum zones 143 and 145 can be turned on and off in an intermittent manner by a vacuum source control circuit. For example, in a high temperature process where even temperature distribution is highly critical, all the vacuum sources may be turned on to secure direct abutting contact between wafer substrate 50 with the wafer supporting surface 22. After that, the attractive forces may be quickly relieved by turning off one or more of the vacuum sources, allowing high mechanical stress created in wafer substrate 50 to be quickly alleviated or released.

The dimension (e.g., diameter) of holes 132 and the density of holes 132 formed on a wafer supporting surface 22 may impact the securing of direct abutting contact between wafer substrate 50 and wafer supporting surface 22, thus providing even temperature distribution on wafer substrate 50. In preferred embodiments, the dimension (e.g., diameter) of holes 132 is preferably in the range of from about $\frac{1}{100}$ of the wafer dimension to about $\frac{1}{10}$ of the wafer dimension. The density of holes 132, measured by the hole-to-hole pitch, is optimized for processing wafer substrates of various materials and dimensions, and is preferably in the range of from about $\frac{1}{50}$ of the wafer dimension (e.g., diameter) to about $\frac{1}{10}$ of the wafer dimension. In preferred embodiments, the number of holes 132 formed on a wafer holding apparatus ranges from just a few to over a hundred, depending upon the dimension of wafer substrate to be processed, the desired process temperature, and the temperature uniformity needed to process the wafer substrate without significant impact on the product yield. As an example, a wafer holding apparatus with eight holes on wafer supporting surface 22 may be used to secure a III-V semiconductor wafer having a diameter of four inches, while a wafer holding apparatus with a hundred holes on wafer supporting surface 22 may be employed to process a twelve-inch silicon wafer. While four concentric rings of holes 132 are illustrated in FIG. 7B, those skilled in the art will recognize numerous variations in the size, pattern, and placement of the holes is obtainable through routine experimentation.

Although the preferred embodiments and their advantages have been described in detail, it should be understood that various changes, substitutions and alterations can be made herein without departing from the spirit and scope of the invention as defined by the appended claims. As an example, it will be readily understood by those skilled in the art that components, materials, and configurations according to the preferred embodiments described above may be varied, substituted, or combined to form even more wafer holding apparatus, while remaining within the scope of the present invention.

Moreover, the scope of the present application is not intended to be limited to the particular embodiments of the process, machine, manufacture, composition of matter, means, methods and steps as described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A wafer holding apparatus for processing a semiconductor wafer comprising:
    a heat-conductive layer disposed on a supporting base, the heat-conductive layer being coupled to a heating circuit;
    a plurality of holes formed through the heat-conductive layer and a first portion of each of the plurality of holes extending into the supporting base;
    a plurality of compressible support members disposed in first portions of respective ones of the plurality of holes, each of the plurality of compressible support members supported at a first end by a bottom surface of respective ones of the plurality of holes; and
    a plurality of heat-conductive lift pins each supported by a second end of respective ones of the plurality of compressible support members, each of the plurality of lift pins coupled to the heating circuit and extending through the holes and over the heat-conductive layer each of the plurality of lift pins having a top end for making direct contact with a wafer held on the heat conductive layer during wafer heating, the wafer having a first shape prior to wafer processing and having a second shape during wafer processing, and each of the plurality of lift pins configured to independently maintain direct contact with the wafer and heat the wafer when the wafer has the first and second shapes.

2. The wafer holding apparatus according to claim 1, wherein each of the plurality of compressible support members is an elastic spring.

3. The wafer holding apparatus according to claim 1, wherein the heat-conductive layer and the plurality of heat conductive lift pins comprise heat-conductive dielectric material.

4. The wafer holding apparatus according to claim 1, further comprising a thin planar chucking electrode encapsulated in the heat-conductive layer, the chucking electrode being coupled to a DC voltage source.

5. The wafer holding apparatus according to claim 1, further comprising a thin planar chucking electrode encapsulated in the heat-conductive layer, the chucking electrode being coupled to an alternating voltage source.

6. The wafer holding apparatus according to claim 1, wherein a diameter of each of the plurality of lift pins is in the range of from about $\frac{1}{100}$ to about $\frac{1}{10}$ of a diameter of the wafer.

7. The wafer holding apparatus according to claim 1, wherein a pin-to-pin pitch of the plurality of lift pins is in the range of from about $\frac{1}{50}$ to about $\frac{1}{10}$ of the diameter of the wafer.

8. The wafer holding apparatus according to claim 1, wherein a number of the plurality of lift pins is in the range of from nine to one hundred.

9. The wafer holding apparatus according to claim 1, wherein the heat-conductive layer and the plurality of heat-conductive lift pins are heatable to a temperature of greater than 800° C.

10. The wafer holding apparatus according to claim 1, further comprising a second plurality of holes formed through the heat-conductive layer, the second plurality of holes being connected to one or more vacuum sources to provide holding forces to secure the wafer on the heat-conductive layer.

11. The wafer holding apparatus according to claim 1, further comprising plurality of wafer substrate clampers fastened on an edge of the supporting base.

12. A wafer holding apparatus for processing a semiconductor wafer comprising:
    a heat-conductive layer disposed on a supporting base, the heat-conductive layer being coupled to a heating circuit;
    a plurality of holes formed through the heat-conductive layer and into the supporting base;
    a plurality of compressible support members disposed in respective ones of the plurality of holes, each of the plurality of compressible support members supported at a first end by a surface of the supporting base; and a plurality of heat-conductive lift pins disposed in the holes and coupled to the heating circuit, each of the lift pins on a second end of respective ones of the plurality of compressible support members and extending from below a top surface of the heat conductive layer to above the top surface of the heat-conductive layer during wafer heating, each of the plurality of lift pins heating the wafer while extended above the top surface of the heat-conductive layer, each of the plurality of lift pins independently making direct contact with a wafer on the heat conductive layer during wafer heating.

13. An apparatus comprising:
a supporting base having a plurality of recesses;
a heat-conductive layer coupled to a heating circuit and disposed on the supporting base;
a plurality of holes formed through the heat-conductive layer, and extending to respective ones of the plurality of recesses; and
a plurality of lift pins disposed in respective ones of the plurality of recesses in the supporting base and coupled to the heating circuit, a compressible member disposed between each of the lift pins and a fixed bottom surface of a respective one of the plurality of recesses, each of the lift pins independently extending above a top surface of the heat-conductive layer during wafer heating and compensating for deformation of the wafer during heating, each of the plurality of the lift pins contacting and heating the wafer while extended above the top surface of the heat-conductive layer.

* * * * *

UNITED STATES PATENT AND TRADEMARK OFFICE
CERTIFICATE OF CORRECTION

| | |
|---|---|
| PATENT NO. | : 8,652,260 B2 |
| APPLICATION NO. | : 12/347580 |
| DATED | : February 18, 2014 |
| INVENTOR(S) | : Chen-Hua Yu et al. |

Page 1 of 1

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1059 days.

Signed and Sealed this
Twenty-second Day of December, 2015

Michelle K. Lee
*Director of the United States Patent and Trademark Office*